(12) United States Patent
Kim

(10) Patent No.: US 7,488,978 B2
(45) Date of Patent: Feb. 10, 2009

(54) TUNNELING-EFFECT THIN FILM TRANSISTOR, METHOD OF MANUFACTURING THE SAME, AND ORGANIC LIGHT-EMITTING DIODE DISPLAY

(75) Inventor: Cheol Se Kim, Daegu-si (KR)

(73) Assignee: LG Display Co., Ltd., Seoul (KR)

( * ) Notice: Subject to any disclaimer, the term of this patent is extended or adjusted under 35 U.S.C. 154(b) by 176 days.

(21) Appl. No.: 11/588,011

(22) Filed: Oct. 26, 2006

(65) Prior Publication Data
US 2007/0287236 A1    Dec. 13, 2007

(30) Foreign Application Priority Data
Jun. 12, 2006   (KR) .................. 10-2006-0052585

(51) Int. Cl.
*H01L 29/04* (2006.01)
(52) U.S. Cl. ............... 257/59; 257/365; 257/E29.275; 438/157; 438/158
(58) Field of Classification Search .......... 438/161, 438/157, 158, 159; 257/59, 365, E29.275
See application file for complete search history.

(56) References Cited

U.S. PATENT DOCUMENTS

| | | | | |
|---|---|---|---|---|
| 5,428,238 A | * | 6/1995 | Hayashi et al. | 257/366 |
| 5,470,768 A | * | 11/1995 | Yanai et al. | 438/161 |
| 5,539,219 A | * | 7/1996 | den Boer et al. | 257/72 |
| 5,605,845 A | * | 2/1997 | Young | 438/157 |
| 5,994,173 A | * | 11/1999 | Oki et al. | 438/161 |
| 2004/0031991 A1 | * | 2/2004 | Jang | 257/347 |

* cited by examiner

*Primary Examiner*—Walter L Lindsay, Jr.
*Assistant Examiner*—Stanetta D Isaac
(74) *Attorney, Agent, or Firm*—Brinks Hofer Gilson & Lione

(57) ABSTRACT

A thin film transistor, a method for manufacturing the thin film transistor, and an organic electroluminescence display using the thin film transistor are disclosed. The thin film transistor includes a gate electrode, a semiconductor layer that overlaps the gate electrode, a first insulating layer disposed between the semiconductor layer and the gate electrode, and first and second electrodes that use the semiconductor layer as a channel, and are disposed at different layers. The thin film transistor further includes a second insulating layer disposed between the semiconductor layer and one of the first and second electrodes, and a first doping semiconductor layer disposed between the semiconductor layer and the other of the first and second electrodes.

32 Claims, 14 Drawing Sheets

TUNNELING-EFFECT THIN FILM TRANSISTOR, METHOD OF MANUFACTURING THE SAME, AND ORGANIC LIGHT-EMITTING DIODE DISPLAY

This application claims the benefit of the Korean Patent Application No. P2006-52585, filed on Jun. 12, 2006, which is hereby incorporated by reference as if fully set forth herein.

FIELD

The present invention relates to a thin film transistor, and more particularly, to a thin film transistor using a tunneling effect, a method for manufacturing the thin film transistor, and an organic light-emitting diode display using the thin film transistor.

BACKGROUND

Currently, a thin film transistor is comprised of source and drain electrodes to supply electrons to a semiconductor layer or to bring the electrons out of the semiconductor layer, and a gate electrode overlapped with the semiconductor layer. An insulating layer is disposed between the gate electrode and the semiconductor layer to thereby control a current. The thin film transistor may be used as an integrated driving circuit, as a switching device to independently drive each sub-pixel of a liquid crystal display (LCD), or as a switching and driving device to independently drive each sub-pixel of an organic light-emitting diode display (OLED). The thin film transistor for driving the sub-pixel of LCD is used as a voltage-supplying device, and the switching and driving thin film transistor for driving the sub-pixel of OLED is used as a current-supplying device.

For example, each sub-pixel of an active-matrix OLED includes an organic light-emitting diode, which is comprised of an organic light-emitting layer between the cathode and the anode, and a pixel driving unit, which independently drives the organic light-emitting diode. The pixel driving unit adjusts the current amount supplied to the organic light-emitting diode based on a data signal to thereby control the brightness of the organic light-emitting diode. Accordingly, the pixel driving unit includes a switching thin film transistor, a capacitor, and a driving thin film transistor at least.

At this time, the driving thin film transistor directly controls the current amount supplied to the organic light-emitting diode based on a voltage charged in the capacitor through the switching thin film transistor, whereby it requires the rapid current supply. For the rapid current supply, the related art thin film transistor has an increased plane area to increase a channel width where the source and drain electrodes face. However, the pixel driving unit including the driving thin film transistor is disposed in a non-luminescence area which has no organic light-emitting layer. To increase an aperture ratio, it is preferable to decrease the plane area of the thin film transistor. For the thin film transistor that supplies the current to the organic light-emitting diode, it is thus preferable to have both the rapid current supply and the decreased size.

SUMMARY OF THE INVENTION

An advantage of the present invention is to provide a thin film transistor which is suitable for a current-supplying device and also can obtain a small size, a method for manufacturing the thin film transistor, and an organic electroluminescence display using the thin film transistor.

A thin film transistor comprises a gate electrode, and a semiconductor layer. The semiconductor layer overlaps the gate electrode. The thin film transistor further comprises a first insulating layer disposed between the semiconductor layer and the gate electrode, first and second electrodes that use the semiconductor layer as a channel, and are disposed at different layers. The thin film transistor also comprises a second insulating layer disposed between the semiconductor layer and one of the first and second electrodes, and a first doping semiconductor layer disposed between the semiconductor layer and the other of the first and second electrodes.

In another aspect of the present invention, a thin film transistor comprises a gate electrode, and a semiconductor layer that overlaps the gate electrode. The thin film transistor further comprises a first insulating layer disposed between the semiconductor layer and the gate electrode, a first electrode disposed between the first insulating layer and the semiconductor layer, a second insulating layer disposed between the first electrode and the semiconductor layer, and a second electrode disposed on the semiconductor layer. The second electrode and the first electrode use the semiconductor layer as a channel. The thin film transistor also comprises a first doping semiconductor layer disposed between the semiconductor layer and the second electrode.

In yet another aspect of the present invention, a method for manufacturing a thin film transistor comprises forming a gate electrode on an insulating substrate, and forming a first insulating layer on the insulating substrate. The first insulating layer covers the gate electrode. The method for manufacturing a thin film transistor further comprises forming a first electrode on the first insulating layer, wherein the first electrode overlaps the gate electrode, forming a second insulating layer on the first insulating layer, wherein the second insulating layer covers the first electrode, and forming a semiconductor layer on the second insulating layer, wherein the semiconductor layer overlaps with the gate electrode and the first electrode. The method for manufacturing a thin film transistor also comprises forming a doping semiconductor layer on the semiconductor layer, and forming a second electrode that overlaps the semiconductor layer. The doping semiconductor layer is disposed between the second electrode and the semiconductor layer.

In further another aspect of the present invention, an organic electroluminescence display comprises an organic light-emitting layer, a pixel electrode that overlaps the organic light-emitting layer, a common electrode that overlaps the pixel electrode. The organic light-emitting layer is disposed between the common electrode and the pixel electrode. The organic electroluminescence display further comprises a pixel driving part that connects the pixel electrode. The pixel driving part includes at least one thin film transistor that comprises a gate electrode, a semiconductor layer that overlaps the gate electrode, a first insulating layer disposed between the semiconductor layer and the gate electrode, and first and second electrodes that use the semiconductor layer as a channel, and are disposed at the different layers. One of the first and second electrodes connects the pixel electrode. The at least one thin film transistor further includes a second insulating layer disposed between the semiconductor layer and the one of the first and second electrodes, and a first doping semiconductor layer disposed between the semiconductor layer and the other of the first and second electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film transistor according to the present invention will be explained with reference to the following drawings.

Figure 1:
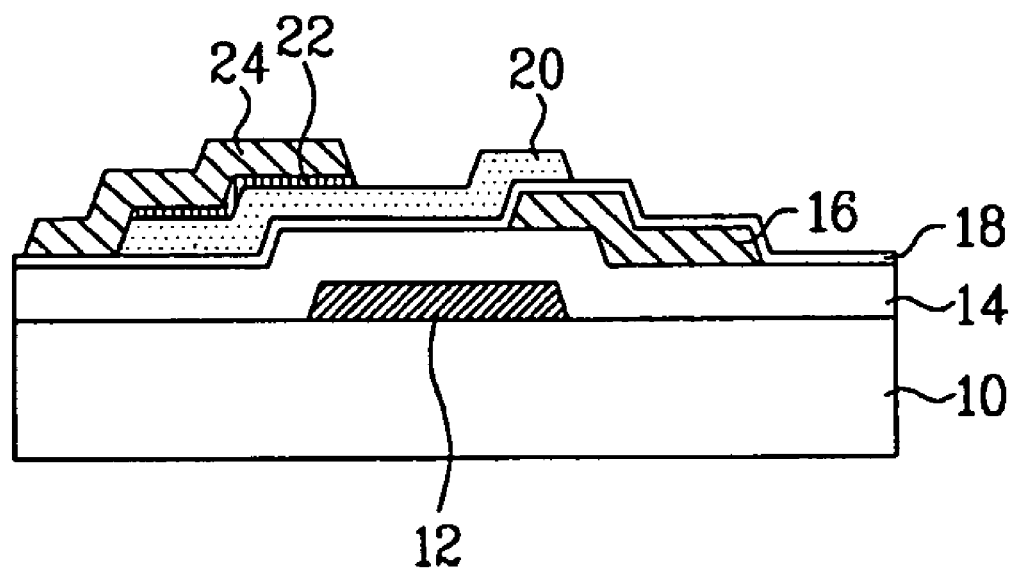
FIG. 1 is a cross section view illustrating a thin film transistor according to the first embodiment of the present invention.

FIG. 1 is a cross section view illustrating a thin film transistor according to the first embodiment of the present invention.

As shown in FIG. 1, the thin film transistor according to the first embodiment of the present invention includes a semiconductor layer 20 that overlaps a gate electrode 12, a first insulating layer 14 disposed between the semiconductor layer 20 and the gate electrode 12, a first electrode 16 that overlaps the gate electrode 12. The first insulating layer 14 is disposed between the first electrode 16 and the gate electrode 12. The first electrode 16 also overlaps the semiconductor layer 20. A second insulating layer 18 is disposed between the first electrode 16 and the semiconductor layer 20. The thin film transistor also includes a second electrode 24 that overlaps the semiconductor layer 20. A doping semiconductor layer 22 is disposed between the second electrode 24 and the semiconductor layer 20. In the above thin film transistor, the first and second electrodes 16 and 24 using the semiconductor layer 20 as a channel are disposed at the different layers, and the second insulating layer 18 for the electron tunneling is disposed between the semiconductor layer 20 and the first electrode 16.

The gate electrode 12 is formed on an insulating substrate 10. On the insulating substrate 10 on which the gate electrode 12 is disposed, there is formed the first insulating layer 14, that is, a gate insulating layer that covers the gate electrode 12. Then, the first electrode 16 as a drain electrode is formed on the first insulating layer 14, wherein the first electrode 16 is partially overlapped with the gate electrode 12. In other words, the first electrode 16 has an overlap portion, which is overlapped with some portions of the gate electrode 12 such that the first insulating layer 14 is disposed between the first electrode 16 and the gate electrode 12, and also has a non-overlap portion, which is extended from the overlap portion and is not overlapped with the gate electrode 12. At this time, the first electrode 15 may be formed of a metal material such as aluminum Al, chrome Cr, copper Cu, molybdenum Mo or alloy thereof, or may be formed of a transparent conductive layer such as ITO (Indium Tin Oxide), TO (Tin Oxide), IZO (Indium Zinc Oxide) or ITZO (Indium Tin Zinc Oxide). When formed of the transparent conductive layer, the first electrode 16 is overlapped with an organic light-emitting layer, whereby the first electrode 16 may be used as a pixel electrode which drives the organic light-emitting layer, and transmits the light from the organic light-emitting layer.

Then, the second insulating layer 18 is formed on the first insulating layer 14 on which the first electrode 16 is disposed, wherein the second insulating layer 18 covers the first electrode 16. The second insulating layer 18 is relatively thin, for example, below 1000 Å, through which a current smoothly flows with effective electron tunneling. The second insulating layer 18 is formed of an inorganic insulating layer such as silicon oxide $SiO_x$, silicon nitride SiNe, and aluminum oxide $Al_2O_3$.

On the second insulating-layer 18, there is formed the semiconductor layer 20, which is partially overlapped with the gate electrode 12 and the first electrode 16. In other words, the semiconductor layer 20 has an overlap portion, which is overlapped with the gate electrode 12 such that the first and second insulating layers 14 and 18 are disposed between the semiconductor layer 20 and the gate electrode 12, and also has an extended portion, which is extended from the overlap portion toward the outside of the gate electrode 12. In this embodiment, the semiconductor layer 20 has the extended portion, which is extended from the overlap portion toward the opposite direction of the first electrode 16. Also, the overlap portion of the semiconductor layer 20 is partially overlapped with the first electrode 16 such that the second insulating layer 18 is disposed between the semiconductor layer 20 and the first electrode 16.

On the semiconductor layer 20, there is formed the second electrode 24, as a source electrode, which is partially overlapped with the semiconductor layer 20 and the gate electrode 12. In addition, the doping semiconductor layer 22 is interposed between the semiconductor layer 20 and the second electrode 24, to thereby decrease a resistance by an ohmic contact. That is, the second electrode 24 has an overlap portion, which is overlapped with the semiconductor layer 20 such that the doping semiconductor layer 22 is disposed between the second electrode 24 and the semiconductor layer 20, and also has an extended portion, which is extended from the overlap portion toward the outside of the semiconductor layer 20 to thereby be in contact with the second insulating layer 18.

In this embodiment, the extended portion of the second electrode 24 is extended from the overlap portion toward the opposite direction of the first electrode 16. Also, the overlap portion of the second electrode 24, being overlapped with the semiconductor layer 20, is partially overlapped with the gate electrode 12 provided under the first insulating layer 14. However, the second electrode 24 is not overlapped with the first electrode 16.

In the above thin film transistor, a current flows between the first and second electrodes 16 and 24 in accordance with a voltage applied to the gate electrode 12 using a tunneling effect of the second insulating layer 18, which is thinly formed between the semiconductor layer 20 and the first electrode 16. In this embodiment, electrons passing through the semiconductor layer 20 are mostly tunneling through a predetermined portion of the second insulating layer 18 provided between facing lateral edges of the semiconductor layer 20 and the second electrode 16, whereby the current flows between the first and second electrodes 16 and 24. In the thin film transistor according to the present invention, the intensity of current is controlled based on the gate voltage applied to the gate electrode 12. Also, it is possible to control the resistant components by adjusting the semiconductor layer 20 and the second insulating layer 18 in effective thickness, whereby the maximum intensity of current is controlled based on the voltage applied to the gate electrode 12.

Figure 2A:
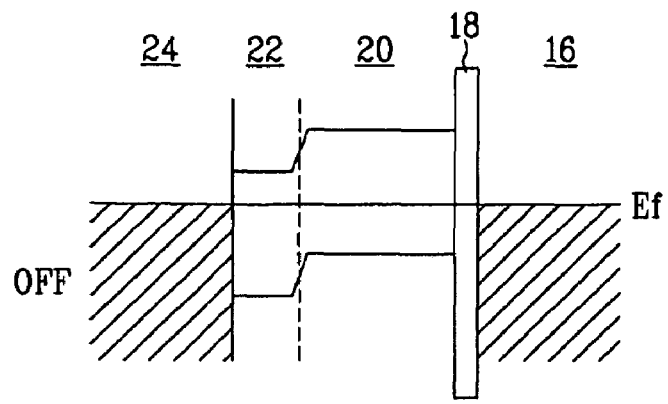
FIGS. 2A to 2C is a cross section view illustrating an energy band according to the driving of the thin film transistor shown in FIG. 1.
Figure 2B:
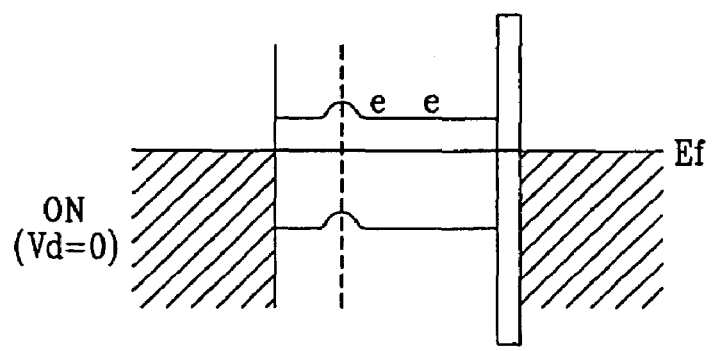
Figure 2C:
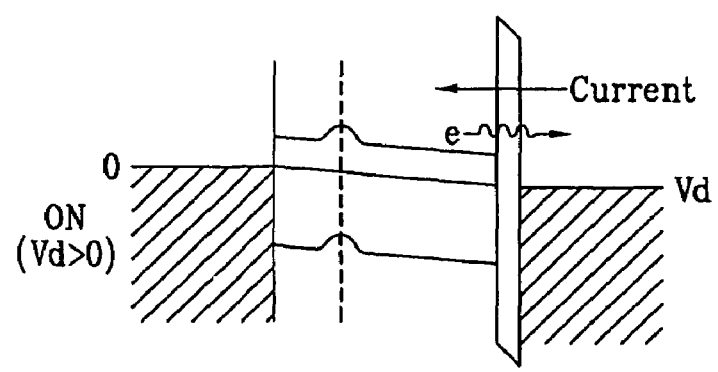

Accordingly to maintain the off-state as the voltage is not applied to the gate electrode 12, as shown in FIG. 2A, the flow of electrons is interrupted by a conduction band of the semiconductor layer 20, which is higher than a Fermi-level Ef of the first and second electrodes 16 and 24, that is, a high resistance of the semiconductor layer and an energy barrier of the second insulating layer 18. In case of the on-state by applying the gate voltage to the gate electrode 12, as shown in FIGS. 2B and 2C, the conduction band of the semiconductor layer 20 adjacent to the second insulating layer 18 is lowered to the Fermi-level Ef, whereby the semiconductor layer 20 has the high conductivity. Also, the thickness of the second insulating layer 18 is decreased so that the current flows between the first and second electrodes 16 and 24. As the conduction band of the semiconductor layer 20 is varied based on the voltage applied to the gate electrode 12, the intensity of current is controlled. Also, the maximum current intensity is determined based on the thickness of the semiconductor layer 20 and the second insulating layer 18.

According to the present embodiment, the maximum current intensity can be controlled by the thickness of the semiconductor layer 20 and the second insulating layer 18, that is, the height thereof, so that it is possible to achieve the decreased size in comparison with the case of controlling the plane area.

Figure 3A:
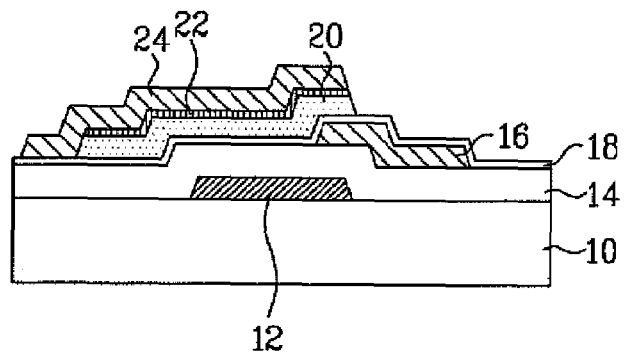
FIGS. 3A to 3C are cross section views illustrating varied structures of the thin film transistor shown in FIG. 1.
Figure 3B:
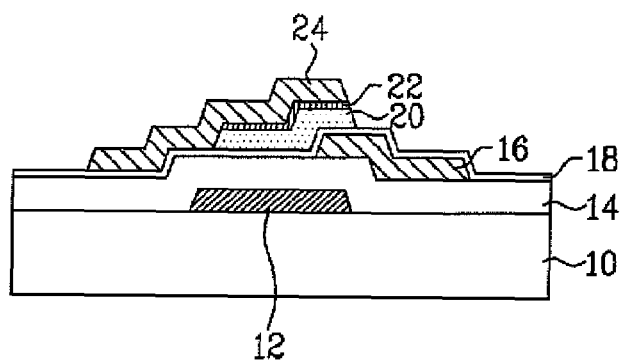
Figure 3C:
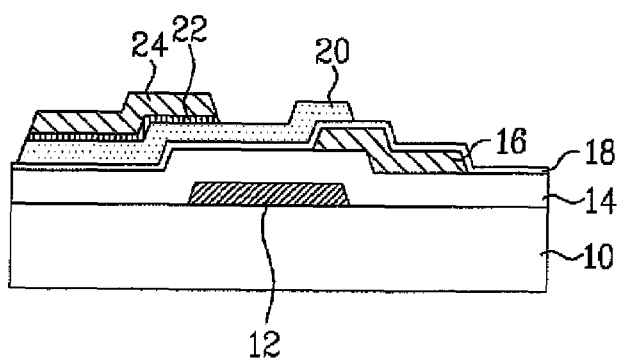

FIGS. 3A to 3C illustrate varied structures of thin film transistor shown in FIG. 1, with emphasis on the semiconductor layer 20, the doping semiconductor layer 22, and the second electrode 24.

Referring to FIGS. 3A and 3B, the second electrode 24 may be overlapped with one side of the first electrode 16 such that the doping semiconductor layer 22, the semiconductor layer 20 and the second insulating layer 18 are disposed between the second electrode 24 and the first electrode 16. Accordingly, the area of generating the electron tunneling is increased in the second insulating layer 18, whereby the current amount is increased. Specifically, the electrons passing through the semiconductor layer 20 are tunneling through a second portion between a surface of the first electrode 16 and a predetermined portion of a lower surface of the semiconductor layer 20 corresponding to an overlapped portion between the first and second electrodes 16 and 24 as well as a first portion between facing lateral edges of the semiconductor layer 20 and the first electrode 16. Accordingly, the current amount flowing between the first and second electrodes 16 and 24 is increased. As shown in FIG. 3A, the semiconductor layer 20 and the doping semiconductor layer 22 may have a non-overlap portion, which is not overlapped with the gate electrode 12. As shown in FIG. 3B, the semiconductor layer 20 and the impurity ions semiconductor layer 22 may be completely overlapped with the gate electrode 12.

Referring to FIG. 3C, the second electrode 24 and the impurity ions semiconductor layer 22 may be completely overlapped with the semiconductor layer 20. To decrease the number of mask processes, the second electrode 24 is formed in the same mask process for forming the doping semiconductor layer 22 and the semiconductor layer 20, which will be explained as follows.

Meanwhile, the thin film transistor shown in FIGS. 3A and 3B may have the structure of completely overlapping the second electrode 24 and the doping semiconductor layer 22 with the semiconductor layer 20.

FIGS. 4A to 4D are cross section views illustrating a method for manufacturing the thin film transistor shown in FIG. 1.

Figure 4A:
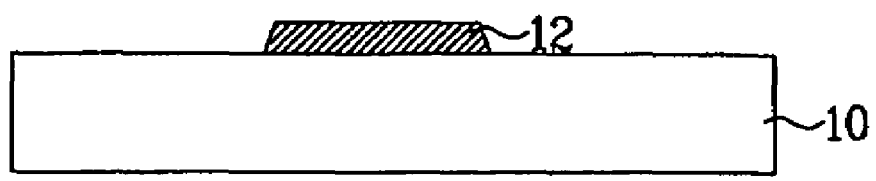
FIGS. 4A to 4D are cross section views illustrating a method for manufacturing a thin film transistor shown in FIG. 1.

Referring to FIG. 4A, the gate electrode 12 is formed on the insulating substrate 10. The insulating substrate 10 is formed of any one of quartz, glass, ceramic, and organic films. The gate electrode 12 is formed by sequential steps of forming a metal layer on the insulating substrate 10 by sputtering; and performing a patterning process of etching and photolithography using a first mask. The gate electrode 12 is formed in a single-layered or multi-layered structure using aluminum Al, chrome Cr, copper Cu, molybdenum Mo or an alloy thereof.

Figure 4B:
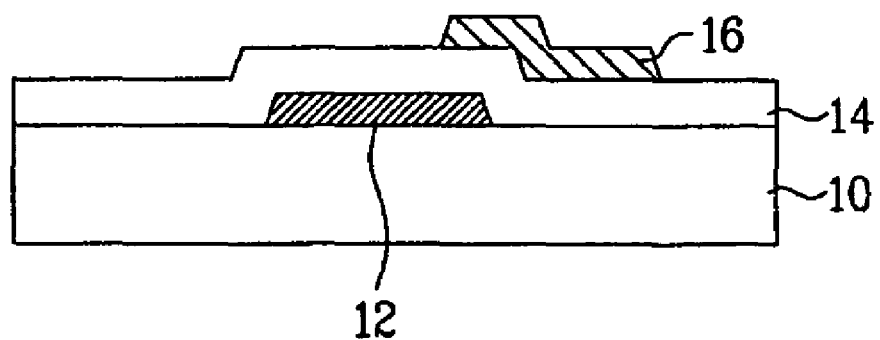

Referring to FIG. 4B, the first insulating layer 14 is formed on the insulating substrate 10 on which the gate electrode 12 is formed, and the first electrode 16 is formed on the first insulating layer 14. The first insulating layer 14 may be formed of an inorganic insulating material such as silicon oxide $SiO_x$ or silicon nitride $SiN_x$ by PECVD (Plasma Enhanced Chemical Vapor Deposition), wherein the first insulating layer 14 covers the gate electrode 12 on the insulating substrate 10. Meanwhile, if the gate electrode 12 is in contact with another signal line, a contact hole is formed by patterning the first insulating layer 14. The first electrode 16 is formed by steps of forming a metal layer on the first insulating layer 14 by sputtering; and performing a patterning process of etching and photolithography using a second mask. The first electrode 16 is formed of a metal material such as aluminum Al, copper Cu, molybdenum Mo, titanium Ti, or an alloy thereof, wherein the first gate electrode 16 may be formed in a single-layered or multi-layered structure. The first electrode 16 may be formed of the transparent conductive layer such as ITO, TO, IZO or ITZO, whereby the first electrode 16 may be used for a pixel electrode to drive an organic light-emitting layer in each sub-pixel of an OLED.

Figure 4C:
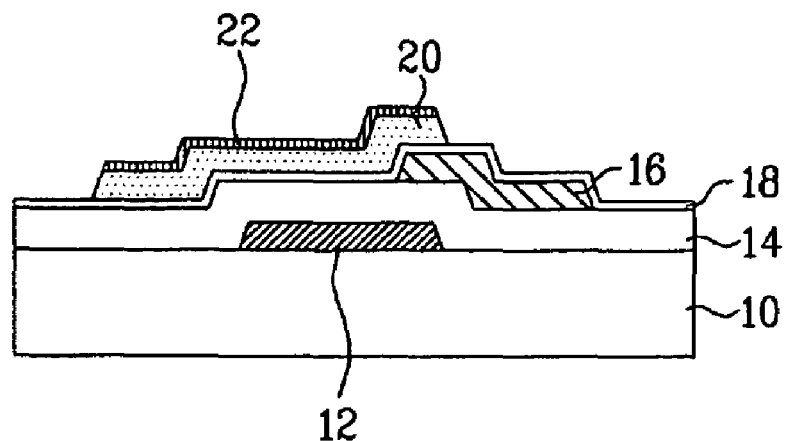

Referring to FIG. 4C, the second insulating layer 18 is formed on the first insulating layer 14 including the first electrode 16, and the semiconductor layer 20 and the doping semiconductor layer 22 are deposited on the second insulating layer 18 in sequence. The second-insulating layer 18 is formed of an insulating material such as silicon oxide $SiO_x$, silicon nitride $SiN_x$ or aluminum oxide $Al_2O_3$, wherein the second insulating layer 18 thinly covers the first electrode 16 on the first insulating layer 14 by PECVD. For example, the second insulating layer 18 is formed at a thickness of 1000 Å or less for effective tunneling of electrons.

The semiconductor layer 20 and the doping semiconductor layer 22 are sequentially formed on the second insulating layer 18 by PECVD, and then are patterned by etching and photolithography using a third mask. The semiconductor layer 20 is generally formed of amorphous silicon (a-Si). The semiconductor layer 20 may be formed of amorphous germanium (a-Ge), amorphous silicon-germanium (a-SiGe), polysilicon (Poly-Si), or poly-germanium (Poly-Ge). Also, the semiconductor layer 20 may be formed of a semiconductor layer including a small amount of impurity ions such as $n^-$a-Si. The doping semiconductor layer 22 may be formed of a semiconductor layer including a large amount of impurity ions such as $n^+$a-Si.

Figure 4D:
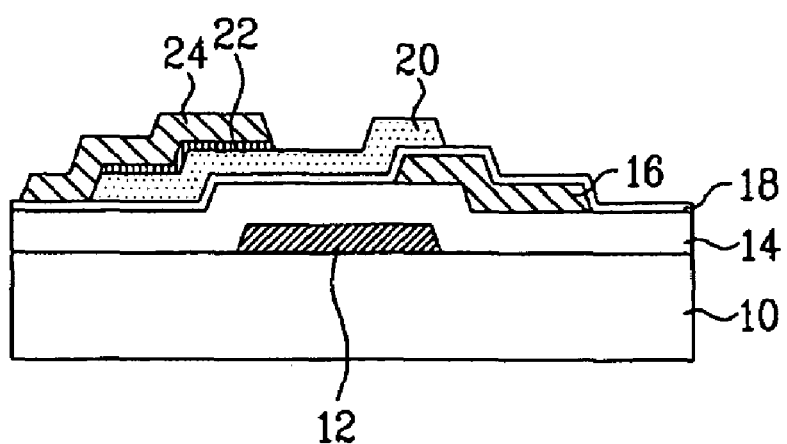

Referring to FIG. 4D, the second electrode 24 is formed on the second insulating layer 18 on which the semiconductor layer 20 and the doping semiconductor layer 22 are sequentially deposited. The second electrode 24 is formed by sequential steps of forming a metal layer to cover the semiconductor layer 20 and the doping semiconductor layer 22 on the second insulating layer 18 by sputtering; and performing a patterning process of etching and photolithography using a fourth mask. The second electrode 24 is formed of a metal material such as aluminum Al, copper Cu, molybdenum Mo, titanium Ti, or an alloy thereof, wherein the second electrode 24 may be formed in a single-layered or multi-layered structure. Subsequently, the predetermined portion of the doping semiconductor layer 22 that is not covered with the second electrode 24 is removed by using the second electrode 24 as a mask, or by using the remaining photoresist provided on the second electrode 24 as a mask. Accordingly, the non-overlap portion of the semiconductor layer 20, which is not overlapped with the second electrode 24, is exposed.

To remove the exposed doping semiconductor layer 22, the fourth mask may be a diffraction exposure mask or a half-tone mask in the mask process for forming the second electrode 24. If using the diffraction exposure (half-tone) mask, a photoresist pattern corresponding to a diffraction exposure part (half-tone transmitting part) on photolithography is provided on the portion from which the doping semiconductor layer 22 will be removed, wherein the photoresist pattern corresponding to the diffraction exposure part is thinner than a photoresist pattern corresponding to the second electrode 24.

Then, the metal layer is patterned by the etching process using the photoresist pattern, to thereby form the second electrode 24. Subsequently, the thickness of the photoresist pattern is decreased by the subsequent etching or ashing, whereby the relatively thin photoresist pattern is removed and a portion of the second electrode 24 is exposed. The exposed portion of the second electrode 24 and a portion of the doping semiconductor layer 22 are removed by the subsequent etching. Also, the photoresist pattern, which remains on the second electrode 24, is removed by stripping.

As shown in FIGS. 3A and 3B, when the second electrode 24 is partially overlapped with the first electrode 16, that is, the semiconductor layer 20 is completely overlapped with the second electrode 24, it is unnecessary to perform the above process for removing the exposed portion of the doping semiconductor layer 22.

Also, the second electrode 24, the doping semiconductor layer 22, the semiconductor layer 20 and the second insulating layer 18 may be formed by one mask process using the diffraction exposure (half-tone) mask. In this case, as shown in FIG. 3C, the second electrode 24 is completely overlapped with the semiconductor layer 20 and the doping semiconductor layer 22, and the predetermined portion of the semiconductor layer 20 is exposed. For example, the second insulating layer 18, the semiconductor layer 20, the doping semiconductor layer 22, and the metal layer are deposited on the first insulating layer 14 on which the first electrode 16 is formed in sequence, and then are patterned using the diffraction exposure (half-tone) mask, thereby forming the second electrode 24 and patterning the doping semiconductor layer 22 and the semiconductor layer 20. As described above, after removing the relatively thin photoresist pattern corresponding to the diffraction exposure part (half-tone transmitting part), the exposed second electrode 24 and the predetermined portion of the doping semiconductor layer 22 are removed to thereby expose the predetermined portion of the semiconductor layer 20.

Figure 5:
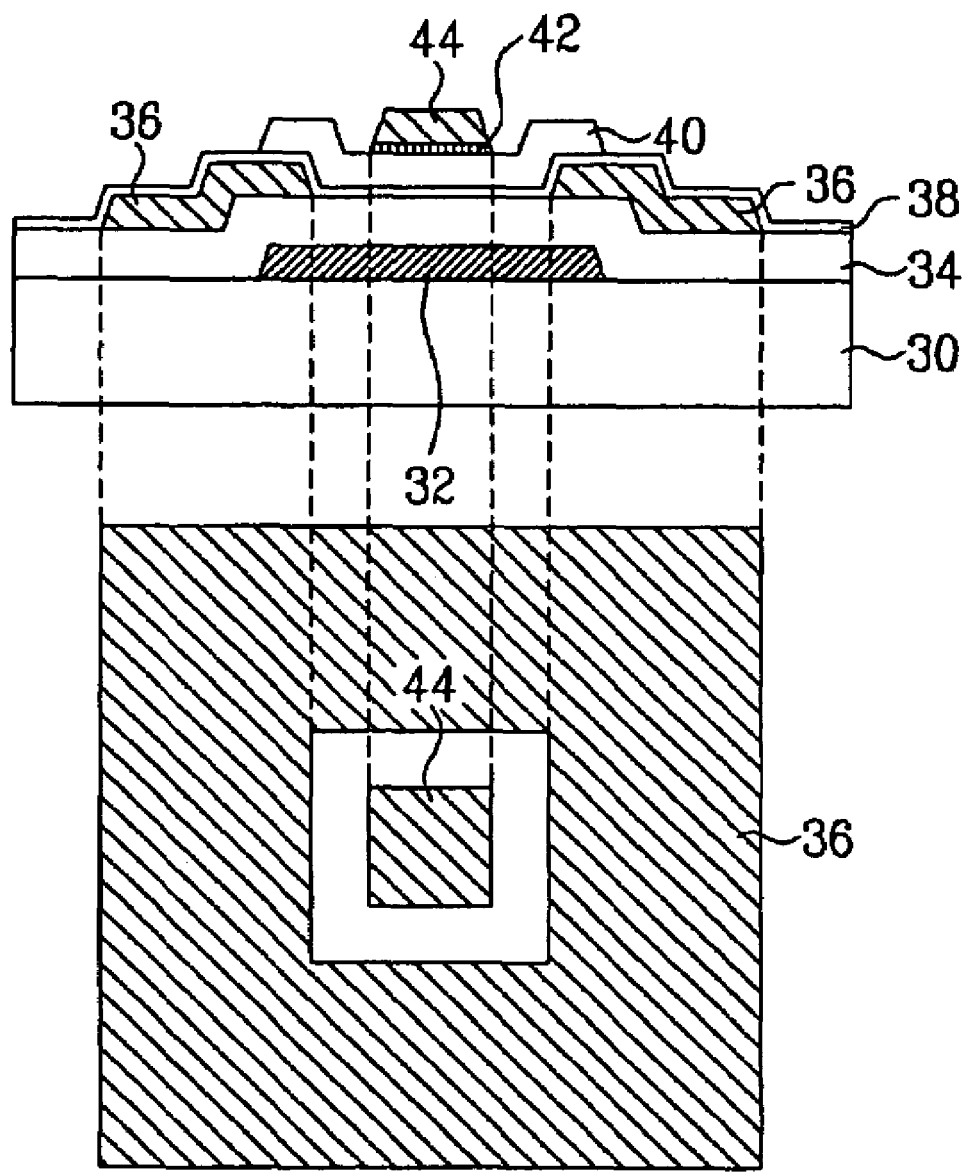
FIG. 5 is a cross section view illustrating a thin film transistor according to the second embodiment of the present invention.
Figure 6:
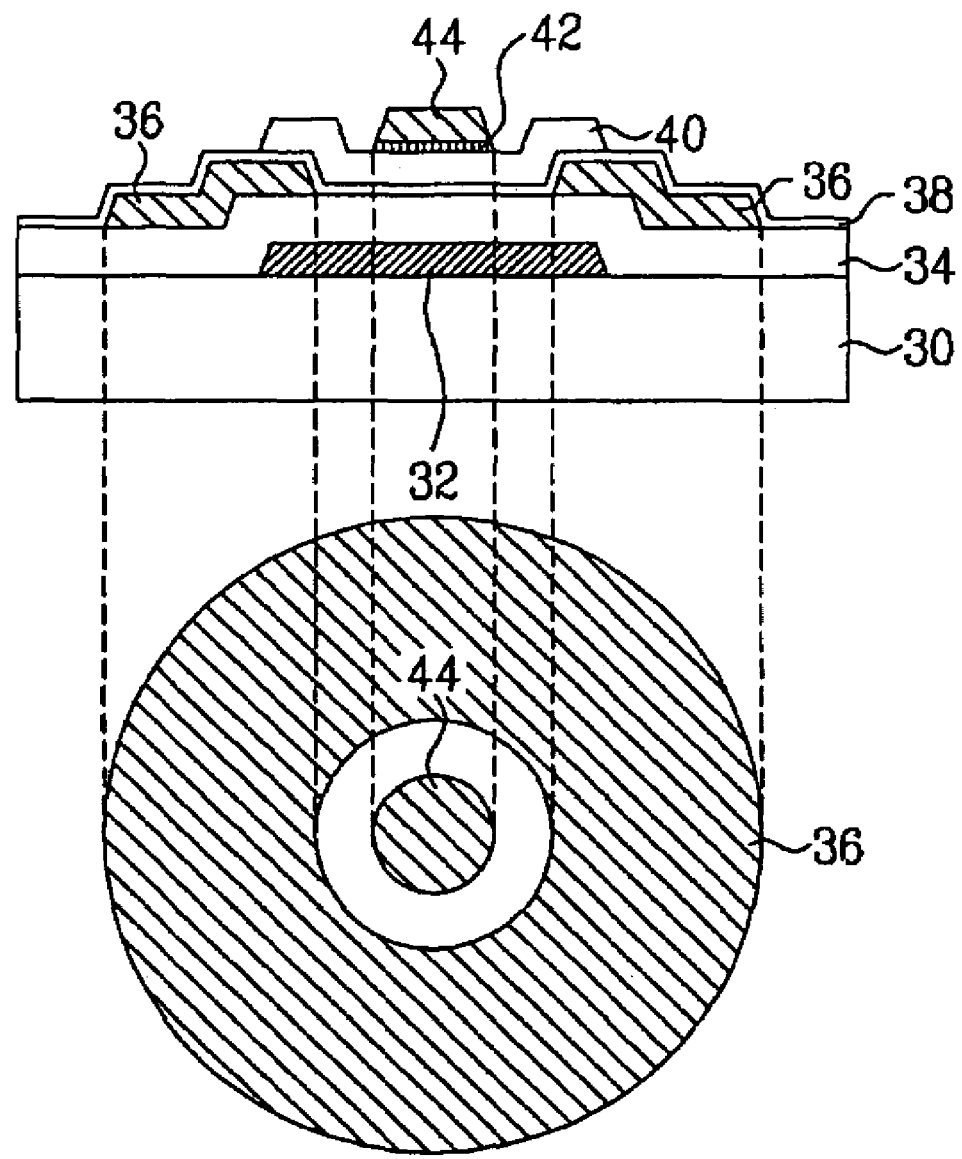
FIG. 6 is a cross section view illustrating varied structures of the first and second-electrodes shown in FIG. 5.

FIGS. 5 and 6 are cross section views illustrating a thin film transistor according to the second embodiment of the present invention.

As shown in FIGS. 5 and 6, the thin film transistor according to the second embodiment of the present invention includes a semiconductor layer 40, which is overlapped with a gate electrode 32, a first insulating layer 34 disposed between the semiconductor layer 40 and the gate electrode 32; a first electrode 36 that overlaps the gate electrode 32 such that the first insulating layer 34 is disposed between the first electrode 36 and the gate electrode 32, and also overlaps the semiconductor layer 40 such that a second insulating layer 38 is disposed between the first electrode 36 and the semiconductor layer 40, and a second electrode 44 that overlaps the semiconductor layer 40 such that an doping semiconductor layer 42 is disposed between the second electrode 44 and the semiconductor layer 40.

The gate electrode 32 is formed on an insulating substrate 30. Then, the first insulating layer 34, that is, a gate insulating layer is formed on the insulating substrate 30 on which the gate electrode 32 is formed, wherein the first insulating layer 34 covers the gate electrode 32.

The first electrode 36, which functions as a drain electrode, is formed on the first insulating layer 34, wherein the first electrode 36 is partially overlapped with the gate electrode 32. In other words, both sides of the gate electrode 32 are overlapped with the respective first electrodes 36. That is, the first electrode 36 has an overlap portion, which is overlapped with the side of the gate electrode 32, and also has an extended portion, which is not overlapped with the gate electrode 32, and is extended from the overlap portion toward the outside of the gate electrode 32. As shown in FIG. 5, the first electrode 36 may have a plane structure in shape of a polygonal frame. As shown in FIG. 6, the first electrode 36 may have a plane structure in shape of a circular frame. Then, the second insulating layer 38 is formed on the first insulating layer 34 including the first electrode 36, wherein the second insulating layer 38 covers the first electrode 36. The second insulating layer 38 is formed at a thickness of 1000 Å or less for effective tunneling of electrons.

The semiconductor layer 40 is formed on the second insulating layer 38, wherein the semiconductor layer 40 is partially overlapped with the gate electrode 32 and the first electrode 36. In other words, the semiconductor layer 40 is overlapped with the gate electrode 32 such that the first and second insulating layers 34 and 38 are disposed between the semiconductor layer 40 and the gate electrode 32. The semiconductor layer 40 is overlapped with the side of the first electrode 36, which is overlapped with the side of the gate electrode 32.

The second electrode 44, which functions as a source electrode, is formed on the semiconductor layer 40, wherein the second electrode 44 is overlapped with the semiconductor layer 40 and the gate electrode 32. In addition, the doping semiconductor layer 42 is interposed between the semiconductor layer 40 and the second electrode 44. As shown in FIGS. 5 and 6, the second electrode 44 is formed with a predetermined space from the first electrode 36 on the plane view, that is, the second electrode 44 is formed inside the polygonal or circular frame of the first electrode 36. In other words, on the plane view, the first electrode 36 surrounds the second electrode 44. Accordingly, it is possible to prevent the interval between the first and second electrodes 36 and 44 from being non-uniform, thereby preventing the non-uniform current intensity caused by a process error. Also, the portion that generates the electron tunneling is increased in the second insulating layer 38, that is, the lateral edge of the first electrode 36 being opposite to the lateral edge of the semiconductor layer 40 is increased in size so that the current amount is increased.

Figure 7:
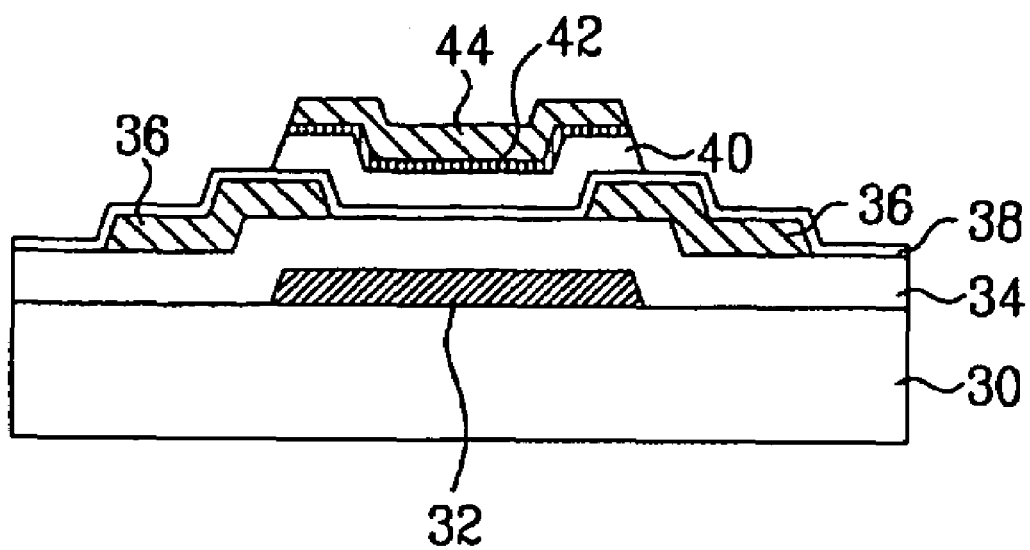
FIG. 7 is a cross section view illustrating a varied structure of the thin film transistor shown in FIG. 5.

As shown in FIG. 7, the second electrode 44 is formed in the same shape as the semiconductor layer 40 as well as the doping semiconductor layer 42. Accordingly, the sides of the second electrode 44 and the doping semiconductor layer 42 are overlapped with one side of the first electrode 36, which is overlapped with the gate electrode 32. In this case, as shown in FIGS. 3A and 3B, the portion that generates the electron tunneling is increased in the second insulating layer 38 due to the overlap of the first and second electrodes 36 and 44, thereby increasing the current amount. Specifically, the electron tunneling of the second insulating layer 38 is generated in a first portion corresponding to the lateral edge facing the first electrode 36 and the semiconductor layer 40, and is also generated in a second portion corresponding to the plane facing the first electrode 36 and the semiconductor layer 40. Also, the second electrode 44, the doping semiconductor layer 42, and the semiconductor layer 40 are formed by one mask process so that it is possible to decrease the number of mask processes, wherein the second electrode 44 and the doping semiconductor layer 42 are formed in the same shape.

In the above thin film transistor, it is possible to control the maximum current intensity by adjusting the semiconductor layer 40 and the second insulating layer 38 in thickness, so that the thin film transistor can be fabricated in a small size.

Figure 8A:
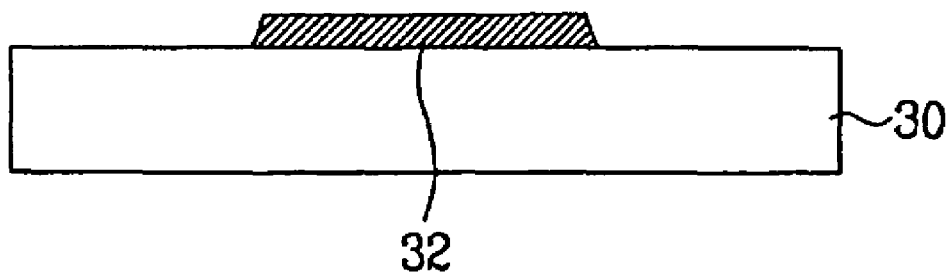
FIGS. 8A to 8D are cross section views illustrating a method for manufacturing a thin film transistor shown in FIG. 5.
Figure 8B:
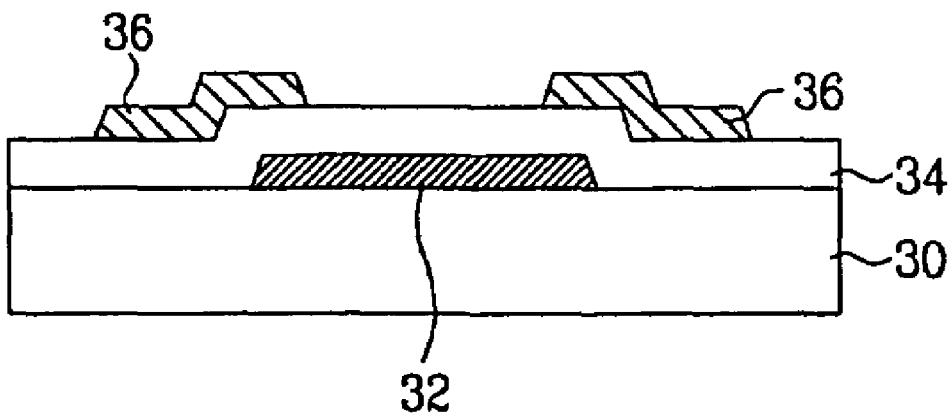
Figure 8C:
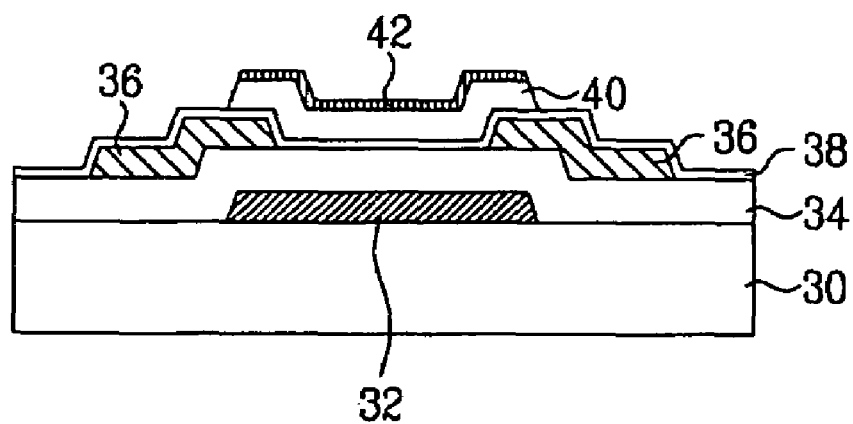
Figure 8D:
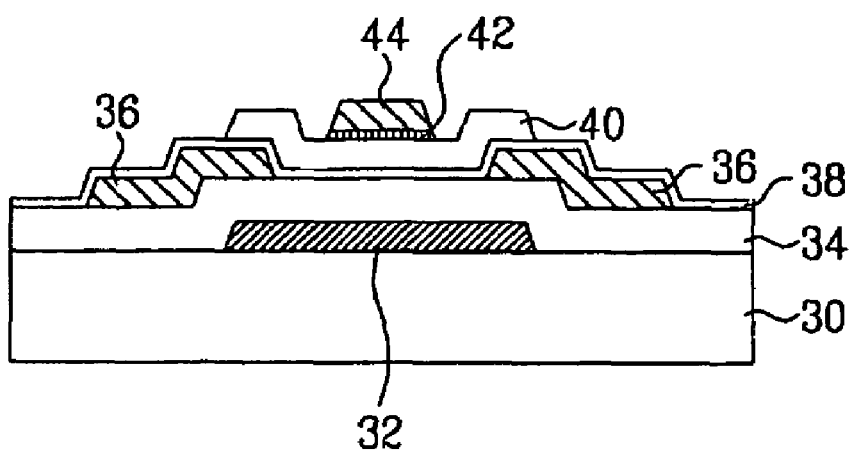

FIGS. 8A and 8D are cross section views illustrating a method for manufacturing the thin film transistor shown in FIGS. 5 and 6. At this time, the steps similar to those of FIGS. 4A to 4D will be explained briefly.

Referring to FIG. 8A, the gate electrode 32 is formed on the insulating substrate 30 by a first mask process.

As shown in FIG. 8B, the first insulating layer 34 is formed on the insulating substrate 30 on which the gate electrode 32 is disposed. Then, the first electrode 36 is formed on the first insulating layer 34 by a second mask process.

Referring to FIG. 8C, the second insulating layer 38 is formed on the first insulating layer 34 on which the first electrode 36 is disposed. Then, the semiconductor layer 40 and the doping semiconductor layer 42 are formed on the second insulating layer 38 by a third mask process.

Referring to FIG. 8D, the second electrode 44 is formed on the second insulating layer 38, on which the semiconductor layer 40 and the doping semiconductor layer 42 are deposited in sequence, by a fourth mask process. Subsequently, the exposed predetermined portion of the doping semiconductor layer 42, which is not covered with the second electrode 44, is removed by using the second electrode 44 as a mask, or by using the remaining photoresist provided on the second electrode 44 as a mask, whereby the predetermined portion of the semiconductor layer 40 is exposed. To remove the exposed doping semiconductor layer 42, the fourth mask of the mask process for forming the second electrode 44 is formed of a diffraction exposure mask or a half-tone mask.

In another way, the second electrode 44, the doping semiconductor layer 42, the semiconductor layer 40 and the second insulating layer 38 may be formed by a one-mask process. In this case, as shown in FIG. 7, the second electrode 44 and the doping semiconductor layer 42 are formed in the same shape as the semiconductor layer 40, that is, the second electrode 44 and the doping semiconductor layer 42 have the edges being continuously formed in connection with the edge of the semiconductor layer 40.

Figure 9:
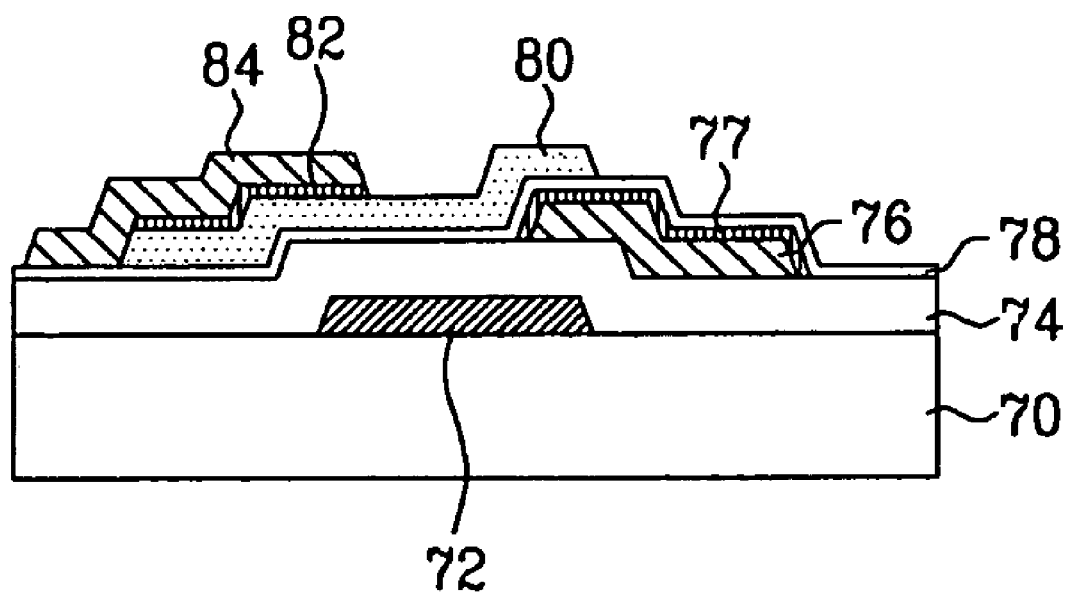
FIG. 9 is a cross section view illustrating a thin film transistor according to the third embodiment of the present invention.

FIG. 9 is a cross section view illustrating a thin film transistor according to the third embodiment of the present invention.

As shown in FIG. 9, the thin film transistor according to the third embodiment of the present invention includes a semiconductor layer 80 that overlaps a gate electrode 72, a first insulating layer 74 disposed between the semiconductor layer 80 and the gate electrode 72, a first electrode 76 that overlaps the gate electrode 72 such that the first insulating layer 74 is disposed between the first electrode 76 and the gate electrode 72, and also overlaps the semiconductor layer 80 such that a second insulating layer 78 is disposed between the first electrode 76 and the semiconductor layer 80. The thin film transistor further includes a second doping semiconductor layer 77 that overlaps the first electrode 76 and is disposed between the first electrode 76 and the second insulating layer 78, a second electrode 84 that overlaps the semiconductor layer 80, and a first doping semiconductor layer 82 disposed between the second electrode 84 and the semiconductor layer 80. That is, the thin film transistor of FIG. 9 is similar in structure to the thin film transistor of FIG. 1, except that the thin film transistor of FIG. 9 includes the second doping semiconductor layer 77 provided between the first electrode 76 and the second insulating layer 78, wherein the components similar to those of FIG. 1 will be explained briefly.

The gate electrode 72 is formed on an insulating substrate 70, and the first insulating layer 74, which covers the gate electrode 72, is formed thereon, wherein the first insulating layer 74 functions as a gate insulating layer. Then, the first electrode 76 as a drain electrode is partially overlapped with the gate electrode 72. The first insulating layer 74 is disposed between the first electrode 76 and the gate electrode 72. The second doping semiconductor layer 77 overlaps the surface of the first electrode 76. Then, the second insulating layer 78 is formed on the first insulating layer 74 including the first electrode 76 and the second doping semiconductor layer 77, wherein the second insulating layer 78 is formed at a thickness of 1000 Å or less. The semiconductor layer 80 is formed on the second insulating layer 78, wherein the semiconductor layer 80 is partially overlapped with the gate electrode 72 and the first electrode 76. On the semiconductor layer 80 is formed the second electrode 84 as a source electrode that overlaps the semiconductor layer 80 and the gate electrode 72. In addition, the first doping semiconductor layer 82 for the ohmic contact is disposed between the semiconductor layer 80 and the second electrode 84.

As a voltage is applied to the gate electrode 72, the second doping semiconductor layer 77, which covers the first electrode 76, forms a conduction band that is close to that of the semiconductor layer 80. Thus, the electrons of the second doping semiconductor layer 77 are easily tunneling through the second insulating layer 78, whereby the electrons are supplied to the semiconductor layer 80. Accordingly, the current smoothly flows from the second electrode 84 to the first electrode 76. By the second doping semiconductor layer 77, the current smoothly flows from the first electrode 76 to the second electrode 84 and from the second electrode 84 to the first electrode 76, that is, the current flows bi-directionally.

Meanwhile, the second doping semiconductor layer 77 shown in FIG. 9 may be applied to the thin film transistor shown in FIGS. 5, 6 and 7, such that the current flows bi-directionally.

FIGS. 10A to 10E are cross section views illustrating a method for manufacturing the thin film transistor shown in FIG. 9. At this time, steps which are identical to those of FIGS. 4A and 4D will be explained briefly.

Figure 10A:
FIGS. 10A to 10E are cross section views illustrating a method for manufacturing a thin film transistor shown in FIG. 9.

Referring to FIG. 10A, the gate electrode 72 is formed on an insulating substrate 70 by a first mask process.

Figure 10B:
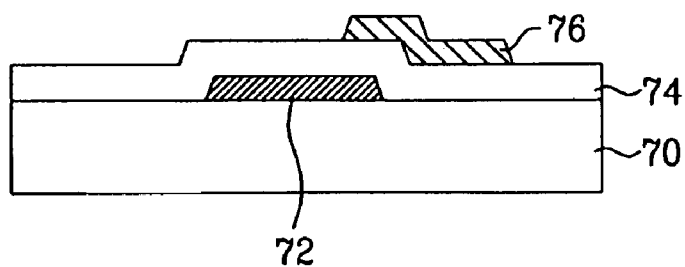

As shown in FIG. 10B, the first insulating layer 74 is formed on the insulating substrate 70 on which the gate electrode 72 is disposed, and the first electrode 76 is formed on the first insulating layer 74 by a second mask process.

Figure 10C:
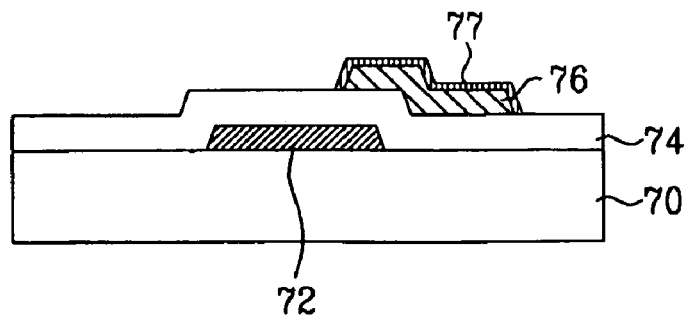

As shown in FIG. 10C, the second doping semiconductor layer 77 is formed on the surface of the first electrode 76 by a third mask process. The second doping semiconductor layer 77 is formed by sequential steps of depositing a predetermined material layer on the first insulating layer 74, on which the first electrode 76 is disposed, by PECVD; and patterning the predetermined material layer by etching and photolithography using a third mask, whereby the second doping semiconductor layer 77 is formed in a structure that remains on the surface of the first electrode 76. The second doping semiconductor layer 77 is formed by adding impurity ions to an intrinsic semiconductor layer such as amorphous silicon (a-Si), amorphous germanium (a-Ge), amorphous silicon-germanium (a-SiGe), poly-silicon (Poly-Si), or poly-germanium (Poly-Ge).

Figure 10D:
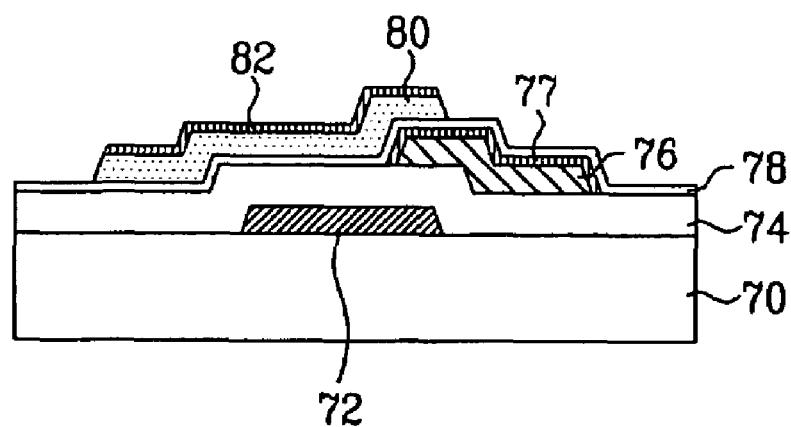

As shown in FIG. 10D, the second insulating layer 78 is formed on the first insulating layer 74, on which the first electrode 76 and the second doping semiconductor layer 77 are disposed. Then, the semiconductor layer 80 and the first doping semiconductor layer 82 are formed on the second insulating layer 78 by a fourth mask process.

Figure 10E:
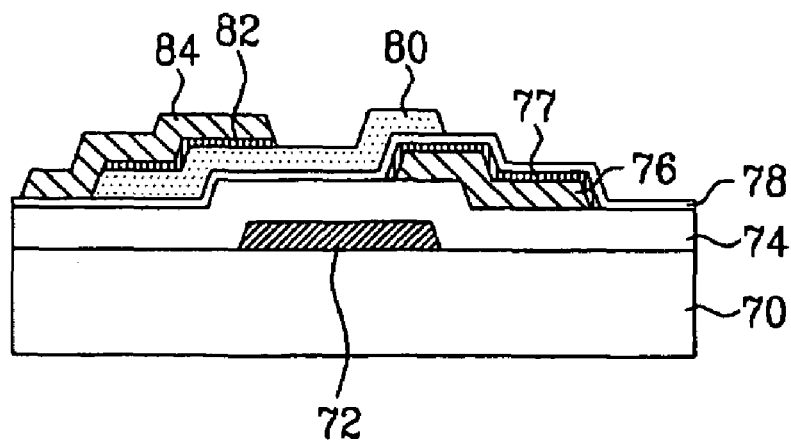

As shown in FIG. 10E, the second electrode 84 is formed on the second insulating layer 78, on which the semiconductor layer 80 and the first doping semiconductor layer 82 are sequentially deposited, by a fifth mask process. Also, the predetermined portion of the first doping semiconductor layer 82, which is not covered with the second electrode 84, is removed by using the second electrode 84 as a mask, or by using the remaining photoresist provided on the second electrode 84 as a mask, whereby the predetermined portion of the semiconductor layer 80 is exposed. To remove the exposed doping semiconductor layer 82, the mask process for forming the second electrode 84 may use a diffraction exposure mask or a half-tone mask.

The second electrode 84, the first doping semiconductor layer 82, the semiconductor layer 80 and the second insulating layer 78 may be formed by a one-mask process. In this case, the second electrode 84 and the first doping semiconductor layer 82 are formed in the same shape as the semiconductor layer 80, that is, the second electrode 84 and the first doping semiconductor layer 82 have the edges being continuously formed in connection with the edge of the semiconductor layer 80.

Figure 11:
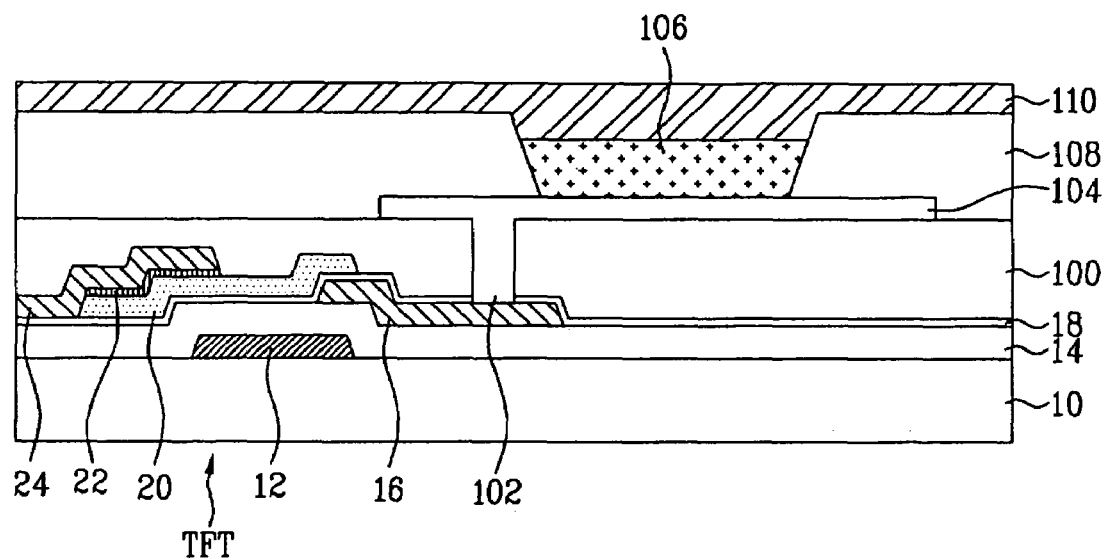
FIG. 11 is a cross section view illustrating one sub-pixel of an organic electroluminescence display to which a thin film transistor shown in FIG. 1 is applied.

FIG. 11 is a cross section view illustrating one sub-pixel of an organic electroluminescence display to which a thin film transistor shown in FIG. 1 is applied.

As shown in FIG. 11, the sub-pixel of the organic electroluminescence display includes a driving thin film transistor (TFT); a pixel electrode 104 which is connected with a first electrode 16 of the driving TFT; an organic light-emitting layer 106, which is formed in a through part of a bank insulating layer 108; and a common electrode 110, which is formed on the organic light-emitting layer 106. In addition, the sub-pixel includes a switching TFT, which is connected with a gate electrode 12 of the driving TFT and is connected with gate and data lines; and a storage capacitor (not shown), which is connected between the gate electrode of the driving-TFT and a power-supplying line.

As explained with respect to FIG. 1, the driving TFT includes a semiconductor layer 20 that overlaps the gate electrode 12; a first insulating layer 14 disposed between the semiconductor layer 20 and the gate electrode 12; a first electrode 16 that overlaps the gate electrode 12 such that the first insulating layer 14 is disposed between the first electrode 16 and the gate electrode 12, and also overlaps the semiconductor layer 20 such that a second insulating layer 18 is disposed between the the first electrode 16 and the semiconductor layer 20; and a second electrode 24 that overlaps the semiconductor layer 20, a doping semiconductor layer 22 disposed between the second electrode 24 and the semiconductor layer 20.

Then, a third insulating layer 100 of an organic insulating material is formed on the second insulating layer 18 by spin-coating or spinless-coating, wherein the third insulating layer covers the second electrode 24. Also, a contact hole 102 is formed by photolithograph or etching, wherein the contact hole 102 exposes a predetermined portion of the first electrode 16 through the third insulating layer 100. At this time, if the third insulating layer 100 is formed of a photosensitive organic material, the contact hole 102 is formed by only the photolithography.

The pixel electrode 104 is formed on the third insulating layer 100, and is connected with the first electrode 16 though the contact hole 102 provided in the third insulating layer 100. The pixel electrode 104 is formed by steps of depositing a transparent conductive material in a deposition method using sputtering; and patterning the transparent conductive material by photolithography and etching. The transparent conductive material is formed of ITO, TO, IZO, or The bank insulating layer 108 is formed on the third insulating layer 100, on which the pixel electrode 104 is formed, by spin-coating or spinless-coating. Also, a through part is formed in the bank insulating layer 108 to expose the pixel electrode 104, wherein the through part is formed by photolithography and etching. If the bank insulating layer 108 is formed of a photosensitive organic material, the through part is formed by photolithography.

The organic light-emitting layer 106 is formed in the through part of the bank insulating layer 108 by deposition using a mask. By repeatedly performing the deposition process using the corresponding mask, red, green and blue organic light-emitting layers 106 are sequentially formed in correspondence with corresponding light-emitting portions.

The common electrode 110 is formed on the organic light-emitting layer 106 and the bank insulating layer 108 by thermal evaporation. The common electrode 110 may be formed of a metal material of molybdenum Mo, aluminum Al, chrome Cr, copper Cu, or an alloy thereof, wherein the common electrode 110 may be formed in a single-layered or multi-layered structure. The common electrode 110 supplies a ground voltage provided from a ground line or a power voltage provided from a power-supplying line to all sub-pixels in common.

When the above thin film transistor according to the present invention is applied to the driving TFT of the organic electroluminescence display, it is possible to control the maximum current intensity by adjusting the thickness of the semiconductor layer and the second insulating layer. Thus, the driving TFT can be manufactured in a small size, so that it is possible to decrease the plane area occupied by the pixel driving part, thereby increasing the aperture ratio.

As mentioned above, the thin film transistor according to the present invention and the method for manufacturing the same have the following advantages.

In the thin film transistor according to the present invention, the thin insulating layer is interposed between the semiconductor layer and any one of the first and second electrodes, which uses the semiconductor layer as the channel. Thus, this structure is suitable for the current-supplying device by adjusting the current with the electron tunneling effect.

In the thin film transistor according to the present invention and the method for manufacturing the same, it is possible to control the maximum current intensity by adjusting the thicknesses of the semiconductor layer and the insulating layer. Accordingly, the thin film transistor according to the present invention can be manufactured in a small size.

Furthermore, the organic electroluminescence display using the thin film transistor according to the present invention can decrease the area, which is occupied by the pixel driving part since the driving-TFT is decreased in size, so that it is possible to increase the aperture ratio.

It will be apparent to those skilled in the art that various modifications and variations can be made in the present invention without departing from the spirit or scope of the inventions. Thus, it is intended that the present application covers the modifications and variations of this invention provided they come within the scope of the appended claims and their equivalents.

What is claimed is:

1. A thin film transistor comprising:
a gate electrode;
a semiconductor layer that overlaps the gate electrode;
a first insulating layer disposed between the semiconductor layer and the gate electrode;
a first electrode disposed between the first insulating layer and the semiconductor layer;
a second insulating layer disposed between the first electrode and the semiconductor layer;
a second electrode disposed on the semiconductor layer, wherein the second electrode and the first electrode use the semiconductor layer as a channel; and
a first doping semiconductor layer disposed between the semiconductor layer and the second electrode.

2. The thin film transistor of claim 1, wherein the first electrode surrounds the second electrode.

3. The thin film transistor of claim 2, wherein the first and second electrodes are not overlapped with each other.

4. The thin film transistor of claim 3, wherein the second electrode is partially overlapped with the semiconductor layer.

5. The thin film transistor of claim 4, further comprising a second doping semiconductor layer disposed between the first electrode and the second insulating layer.

6. The thin film transistor of claim 3, wherein the second electrode is completely overlapped with the semiconductor layer.

7. The thin film transistor of claim 6, wherein at least one edge in the first doping semiconductor layer and the second electrode is continuously provided in connection with at least one edge of the semiconductor layer.

8. The thin film transistor of claim 7, further comprising a second doping semiconductor layer disposed between the first electrode and the second insulating layer.

9. The thin film transistor of claim 2, wherein the first and second electrodes are partially overlapped with each other.

10. The thin film transistor of claim 9, wherein the second electrode is partially overlapped with the semiconductor layer.

11. The thin film transistor of claim 10, further comprising a second doping semiconductor layer disposed between the first electrode and the second insulating layer.

12. The thin film transistor of claim 9, wherein the second electrode is completely overlapped with the semiconductor layer.

13. The thin film transistor of claim 12, wherein at least one edge in the first doping semiconductor layer and the second electrode is continuously provided in connection with at least one edge of the semiconductor layer.

14. The thin film transistor of claim 13, further comprising a second doping semiconductor layer disposed between the first electrode and the second insulating layer.

15. The thin film transistor of claim 1, wherein the second insulating layer has a thickness of 1000 Å or less.

16. An organic electroluminescence display comprising:
an organic light-emitting layer;
a pixel electrode that overlaps the organic light-emitting layer;
a common electrode that overlaps the pixel electrode, the organic light-emitting layer disposed between the common electrode and the pixel electrode; and
a pixel driving part that connects the pixel electrode,
wherein the pixel driving part includes at least one thin film transistor comprising a gate electrode; a semiconductor layer that overlaps the gate electrode; a first insulating layer disposed between the semiconductor layer and the gate electrode; first and second electrodes that use the semiconductor layer as a channel, and are disposed at different layers, wherein one of the first and second electrodes connects the pixel electrode; a second insulating layer disposed between the semiconductor layer and the one of the first and second electrodes; and a first doping semiconductor layer disposed between the semiconductor layer and the other of the first and second electrodes.

17. The organic electroluminescence display of claim 16, wherein the pixel electrode and the one of the first and second electrode that connects the pixel electrode comprise transparent conductive layers.

18. The organic electroluminescence display of claim 16, wherein the first and second electrodes are not overlapped with each other.

19. The organic electroluminescence display of claim 18, wherein the other of the first and second electrodes is partially overlapped with the semiconductor layer.

20. The organic electroluminescence display of claim 19, further comprising a second doping semiconductor layer disposed between the second insulating layer and the one of the first and second electrodes.

21. The organic electroluminescence display of claim 18, wherein the other of the first and second electrodes is completely overlapped with the semiconductor layer.

22. The organic electroluminescence display of claim 21, wherein at least one edge in a first impurity ion layer and the other of first and second electrodes is continuously provided in connection with at least one edge of the semiconductor layer.

23. The organic electroluminescence display of claim 16, wherein the first and second electrodes are partially overlapped with each other.

24. The organic electroluminescence display of claim 23, wherein the other of the first and second electrodes is partially overlapped with the semiconductor layer.

25. The organic electroluminescence display of claim 24, further comprising a second doping semiconductor layer disposed between the second insulating layer and the one of the first and second electrodes.

26. The organic electroluminescence display of claim 23, wherein the other of the first and second electrodes is completely overlapped with the semiconductor layer.

27. The organic electroluminescence display of claim 26, wherein at least one edge in a first impurity ion layer and the other of first and second electrodes is continuously provided in connection with at least one edge of the semiconductor layer.

28. The organic electroluminescence display of claim 27, further comprising a second doping semiconductor layer disposed between the second insulating layer and the one of the first and second electrodes.

29. The organic electroluminescence display of claim 16, wherein the first electrode is disposed at a lower layer of the semiconductor layer, and the second electrode is disposed at an upper layer of the semiconductor layer.

30. The organic electroluminescence display of claim 29, wherein the first electrode is disposed between the first and second insulating layers, and is partially overlapped with the gate electrode and the semiconductor layer, and the second electrode is partially overlapped with the gate electrode with the first and second insulating layers, the semiconductor layer and the first doping semiconductor layer disposed between the second electrode and the gate electrode.

31. The organic electroluminescence display of claim 30, wherein the second insulating layer is disposed between the first electrode and the semiconductor layer.

32. The organic electroluminescence display of claim 16, wherein the second insulating layer has a thickness of 1000 Å or less.

* * * * *